United States Patent
Han

(10) Patent No.: US 7,977,794 B2
(45) Date of Patent: Jul. 12, 2011

(54) ALUMINUM METAL LINE OF A SEMICONDUCTOR DEVICE AND METHOD OF FABRICATING THE SAME

(75) Inventor: Jae Won Han, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 212 days.

(21) Appl. No.: 12/351,365

(22) Filed: Jan. 9, 2009

(65) Prior Publication Data

US 2009/0189283 A1 Jul. 30, 2009

Related U.S. Application Data

(62) Division of application No. 11/646,442, filed on Dec. 28, 2006, now Pat. No. 7,494,921.

(30) Foreign Application Priority Data

Dec. 29, 2005 (KR) ........................ 10-2005-0133338

(51) Int. Cl.
*H01L 23/52* (2006.01)
(52) U.S. Cl. ......... 257/751; 257/758; 257/763; 257/765
(58) Field of Classification Search .................. 257/751, 257/758, 763, 765
See application file for complete search history.

(56) References Cited

U.S. PATENT DOCUMENTS

| 6,319,727 | B1 | 11/2001 | Vlassak |
| 6,346,480 | B2 | 2/2002 | Yamamoto et al. |
| 6,383,914 | B1 | 5/2002 | Yasuda |
| 6,528,414 | B1 | 3/2003 | Kasuya |
| 7,057,285 | B2 * | 6/2006 | Lee et al. ......................... 257/751 |
| 7,119,440 | B2 * | 10/2006 | Huang ........................... 257/751 |

* cited by examiner

*Primary Examiner* — Zandra Smith
*Assistant Examiner* — Christy L Novacek
(74) *Attorney, Agent, or Firm* — Finnegan, Henderson, Farabow, Garrett & Dunner, L.L.P.

(57) ABSTRACT

A method of forming an aluminum line of a semiconductor device where first A metal thin layer, a first aluminum layer, and a first B metal thin layer are sequentially applied on an interlayer insulating layer. A photolithography process is performed to form a metal line pattern, and etching is performed thereon. An intermetallic dielectric layer is applied on the metal line pattern. The first B metal thin layer is removed by a chemical mechanical planarization process to form a first stage metal line. A second aluminum layer and a second metal thin layer are sequentially applied. Photoresist is applied, a photolithography process is performed to form a metal line pattern, and etching is performed to form a second stage metal line. An intermetallic dielectric layer is applied on the second stage metal line. A chemical mechanical planarization process is performed on the second intermetallic dielectric layer.

9 Claims, 4 Drawing Sheets

ALUMINUM METAL LINE OF A SEMICONDUCTOR DEVICE AND METHOD OF FABRICATING THE SAME

RELATED APPLICATION

This application is a division of application Ser. No. 11/646,442, filed Dec. 28, 2006 now U.S. Pat. No. 7,494,921, which is based upon and claims the benefit of priority to Korean Application No. 10-2005-0133338 filed on Dec. 29, 2005. The entire contents of these applications are incorporated herein by reference.

BACKGROUND

1. Technical Field

The present invention relates to an aluminum metal line of a semiconductor device, and a method of fabricating the same.

2. Description of the Related Art

A metal line of the related art semiconductor device is generally formed by an aluminum (Al) line process. When the aluminum line process technology is used in which the critical dimension (CD) of the line is 130-nanometers (nm), many problems may occur.

In semiconductor devices with 130 nm aluminum lines, the CD of the aluminum line and the distance between the aluminum lines become very small. The CD of the aluminum line is 0.15 micrometers (μm), and the distance between the aluminum lines is 0.17 μm. Even though the aluminum lines must maintain small electric resistance because of its characteristics, such a fine CD in such a fine structure of the aluminum lines may cause an undesirable increase in electric resistance.

In a photolithography process of 130 nm aluminum line process, photoresist (PR) on the CD collapses because of the fine CD of the aluminum lines. The collapse of the PR causes a short of the aluminum lines.

An intermetallic dielectric (IMD) process for gap filling between the aluminum lines reaches a limit, and voids are generated by the defective gap filling. Therefore, the aluminum line is formed with a great thickness, so that the electric resistance can be reduced even if the CD value of the aluminum line is small. However, in this case, it is difficult to implement a narrow aluminum line with a thick profile.

BRIEF SUMMARY

Consistent with the present invention there is provided an aluminum metal line of a semiconductor device, and a method of fabricating the same that substantially obviate one or more problems due to limitations and disadvantages of the related art.

Consistent with the present invention there is provided a method of forming an aluminum line of a semiconductor device, which can prevent a short of an aluminum line, reduce electric resistance, and prevent bubble generation when a 130 nm aluminum line is formed.

Consistent with the invention, as embodied and broadly described herein, there is provided a method of forming an aluminum line of a semiconductor device, including: sequentially applying a first A metal thin layer, a first aluminum layer, and a first B metal thin layer on an interlayer insulating layer including one of a contact and a via; applying photoresist, performing a photolithography process to form a metal line pattern, and performing etching thereon; applying an intermetallic dielectric layer on the first metal line pattern; removing the first B metal thin layer by a chemical mechanical planarization process to form a first stage metal line; sequentially applying a second aluminum layer and a second metal thin layer; applying photoresist, performing a photolithography process to form a metal line pattern, and performing etching to form a second stage metal line; applying a an intermetallic dielectric layer; and performing a chemical mechanical planarization process of the second intermetallic dielectric layer.

Here, each of the first A and B metal thin layers may be one of a single layer and a double layer. The single layer may be formed of one of titanium and titanium nitride, and the double layer may be formed of titanium and titanium nitride. The first A metal thin layer may have a thickness ranging from about 100 to 400 Å. The first B metal thin layer may have a thickness ranging from about 100 to 1000 Å. Each of the first and second aluminum layers may have a thickness ranging from about 500 to 2000 Å. The second metal thin layer may be a double layer formed of titanium and titanium nitride. The second metal thin layer may have a thickness ranging from about 100 to 1000 Å.

In another aspect consistent with the present invention, there is provided an aluminum line of a semiconductor device including: a first stage metal line formed by sequentially applying a first A metal thin layer, a first aluminum layer, a first B metal thin layer, and an intermetallic dielectric layer on an interlayer insulating layer, wherein the first A metal thin layer, which is one of a single layer being formed of one of titanium and titanium nitride and a double layer being formed of titanium and titanium nitride, includes the first stage metal thin layer further formed by performing a photolithography process on a resulting structure to form a first metal line pattern, and performing a chemical mechanical planarization process to remove the first B metal thin layer; and a second stage metal line formed by sequentially applying, on the first stage metal line, a second aluminum layer and a second metal thin layer formed as a double layer of titanium and titanium nitride, performing a photolithography process to form a second metal line pattern which is the same as the first metal line pattern, applying a second intermetallic dielectric layer, and performing a chemical mechanical planarization process to remove the second intermetallic dielectric layer.

It is to be understood that both the foregoing general description and the following detailed description consistent with the present invention are exemplary and explanatory and are intended to provide further explanation consistent with the invention as claimed.

BRIEF DESCRIPTION OF THE DRAWINGS

The accompanying drawings, which are included to provide a further understanding consistent with the invention and are incorporated in and constitute a part of this application, illustrate embodiment(s) consistent with the invention and together with the description serve to explain the principle consistent with the invention. In the drawings.

DETAILED DESCRIPTION

Reference will now be made in detail to the preferred embodiments consistent with the present invention, examples of which are illustrated in the accompanying drawings. Wherever possible, the same reference numbers will be used throughout the drawings to refer to same or similar parts.

A method of forming an aluminum line of a semiconductor device according to an embodiment consistent with the present invention will now be described with reference to FIGS. 1 through 9. FIGS. 1 through 9 are cross-sectional views illustrating a method of forming an aluminum line of a semiconductor device according to an embodiment consistent with the present invention.

Figure 1:
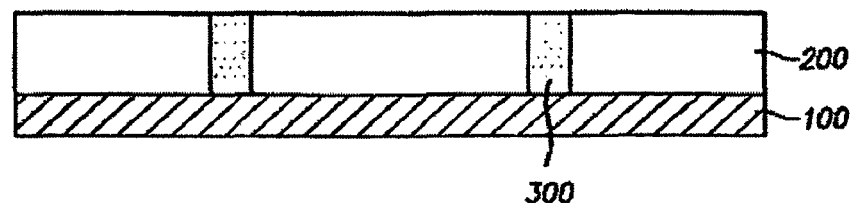
FIGS. 1 through 9 are cross-sectional views of a method of forming an aluminum line of a semiconductor device according to an embodiment consistent with the present invention.

Referring FIG. 1, a via 300 is formed in an interlayer insulating layer 200 formed on a lower metal line 100. Interlayer insulating layer 200 may be a polysilicon metal dielectric (PMD) layer when a contact is formed, or may be an intermetallic dielectric (IMD) layer when via 300 is formed. Here, the PMD layer or the IMD layer is a layer formed of an insulating layer between metal lines.

Figure 2:
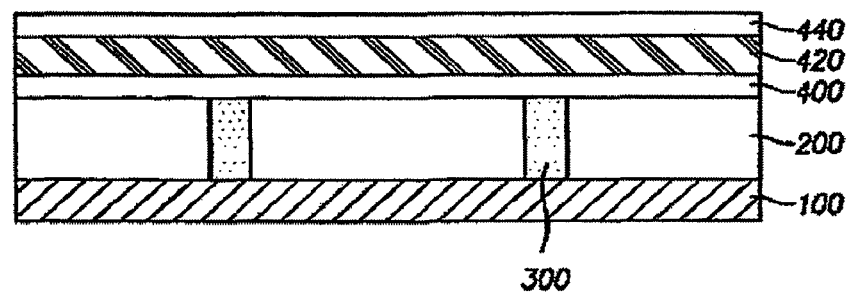

Referring to FIG. 2, a first A metal thin layer 400, a first aluminum layer 420, and a first B metal thin layer 440 are sequentially applied on interlayer insulating layer 200.

First A metal thin layer 400 may be a single layer of titanium (Ti) or titanium nitride (TiN), or may be a double layer formed by sequentially applying Ti and TiN.

In order to ensure a margin allowing an aluminum line process, the thickness of first A metal thin layer 400 may range from about 100 to 400 Å.

The thickness of first aluminum layer 420 may range from about 500 to 2000 Å. First B metal thin layer 440 applied on first aluminum layer 420 may be a single layer formed of Ti or TiN, or may be a double layer formed by sequentially applying Ti or TiN. In order to ensure a margin for the aluminum line process, first B metal thin layer 440 may range from about 100 to 1000 Å.

Figure 3:
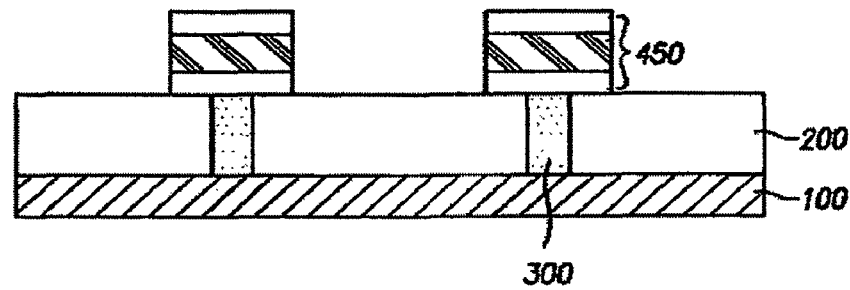

Photoresist (not shown) is applied on first B metal thin layer 440. Referring to FIG. 3, a metal line pattern 450 is formed by a photolithography process. After etching, the photoresist is removed by ashing, and a cleaning process is performed.

Figure 4:
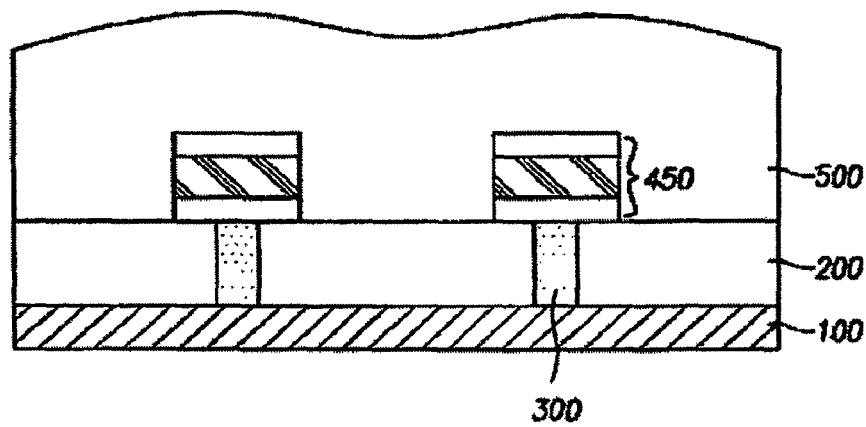

Referring to FIG. 4, an IMD layer 500 is applied.

Figure 5:
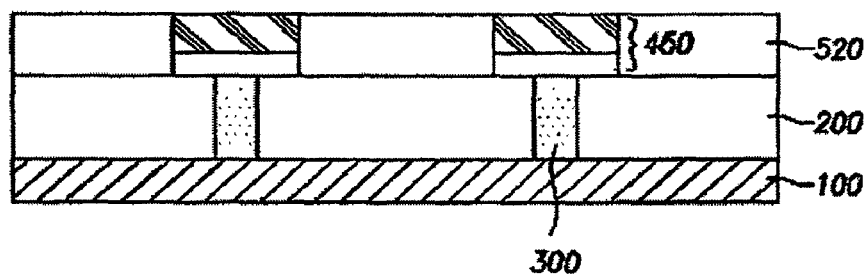

Referring to FIG. 5, first B metal thin layer 440 is completely removed from first metal line pattern 450 by a chemical mechanical planarization process, thereby forming a first stage metal line 460.

IMD layer 500 is then planarized by chemical mechanical planarization process forming planarized IMD layers 520.

In order to secure a margin for lithography, etching, and gap filling, the thickness of first stage metal line 460, which may be a first aluminum line, may be a maximum of 2500 Å obtained by adding the thickness of first A metal thin layer 400 and first aluminum layer 420 together.

Figure 6:
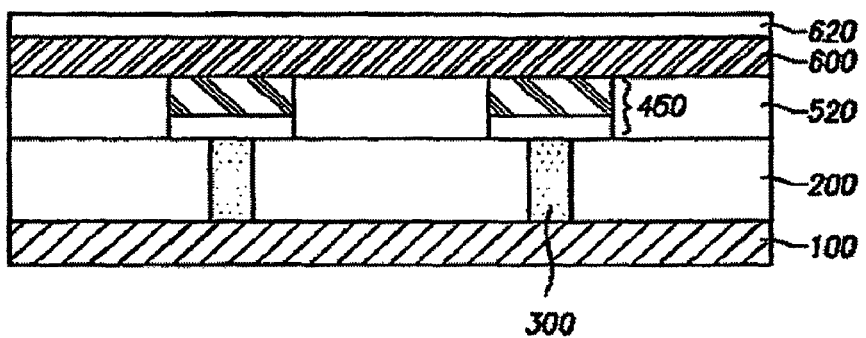
Figure 7:
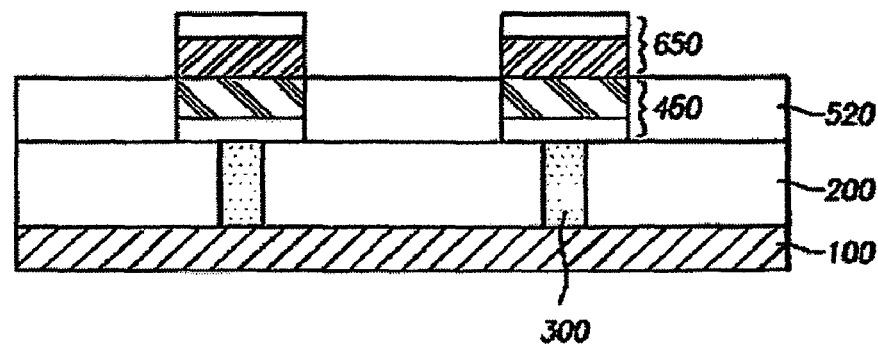

Referring to FIG. 6, a second aluminum layer 600 and a second metal thin layer 620 are sequentially applied on first stage metal line 460. Referring to FIG. 7, a photolithography process is performed, thereby forming a second stage metal line 650, a second stage aluminum line, which has the same pattern as that of first stage metal line 460. Here, like first aluminum layer 420, second aluminum layer 600 also has a thickness ranging from about 500 to 2000 Å, and second metal thin layer 620 also has a thickness ranging from about 100 to 400 Å, like first A metal thin layer 400.

Thus, when each of first and second stage metal lines 460 and 650, which may be aluminum lines, is formed with a maximum thickness of about 2500 Å in the process of forming first stage metal line 460 and second stage metal line 650, photoresist (PR) may be applied with a thickness of about 5000 Å. Due to thickness of the first and second stage metal lines 460 and 650, a PR having this thickness does not collapse.

Accordingly, a short of the aluminum lines caused by the PR collapse, which frequently occurred in the related art, may be prevented.

Figure 8:
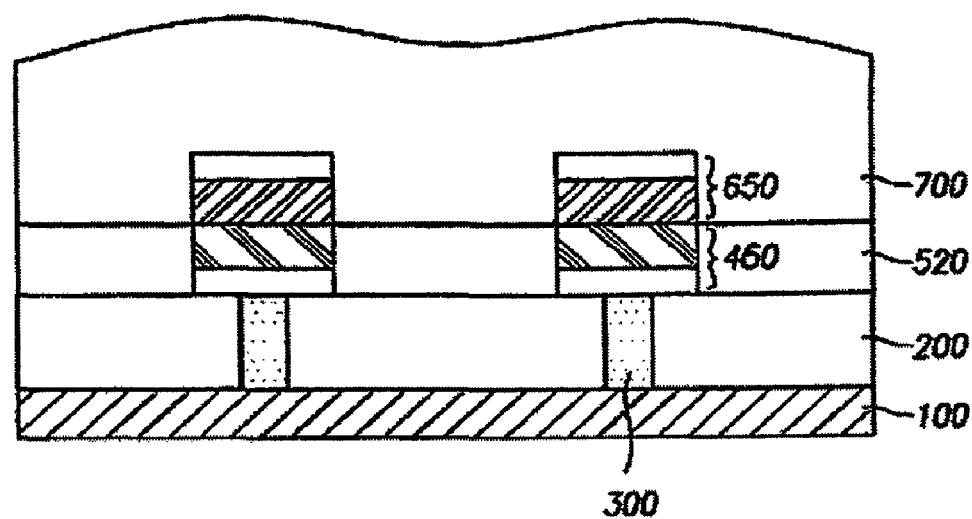
Figure 9:
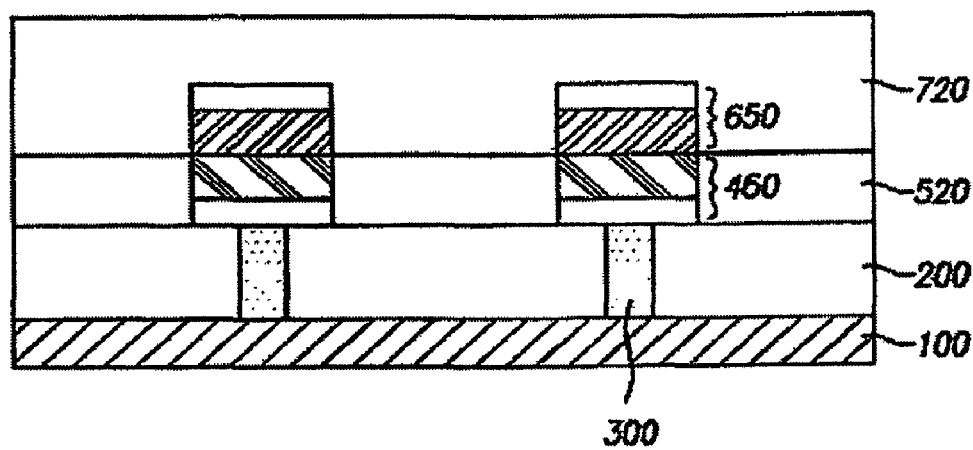

Referring to FIG. 8, an IMD layer 700 is applied. Referring to FIG. 9, IMD layer 700 is planarized to a proper thickness, such that, IMD layer 700 is in a planarized state 720, and thus the following via process may be performed.

Accordingly, consistent with the present invention, second stage metal line 650 having the same pattern as that of first stage metal line 460 is formed on first stage metal line 460, so that the thickness of the entire aluminum line is increased, and electric resistance is lowered.

By forming a two-stage aluminum line, the aluminum line may secure the maximum thickness 5000 Å. Also, a three-stage aluminum line with a maximum thickness of 7500 Å, and a four-stage aluminum line with a maximum thickness of 10000 Å may be formed. As the electric resistance is lowered by an increase in thickness of the aluminum line, a resistance capacitance (RC) delay value of the semiconductor device is also reduced, thereby increasing a driving speed of the semiconductor device. The multi-stage aluminum line may prevent void generation, which occurred in the related art because of defective gap filling in a process of applying an IMD layer between the aluminum lines.

Consistent with the present invention, as the two-stage aluminum line is formed by the method of forming an aluminum line of the semiconductor device, the thickness of the aluminum line is increased, and thus electric resistance may be lowered. Accordingly, a driving speed of the semiconductor device may be improved, and a short of the aluminum line caused by PR collapse may be prevented.

Also, void generation is prevented from occurring due to defective gap filling in the process of applying the IMD layer between aluminum lines.

It will be apparent to those skilled in the art that various modifications and variations can be made without departing from the spirit and scope consistent with the invention and the following claims.

What is claimed is:

1. An aluminum line of a semiconductor device comprising:
   a first stage metal line formed by sequentially applying a first A metal thin layer, a first aluminum layer, a first B metal thin layer, and an intermetallic dielectric layer on an interlayer insulating layer, wherein the first A metal thin layer, which is one of a single layer being formed of one of titanium and titanium nitride and a double layer being formed of titanium and titanium nitride, includes the first stage metal thin layer further formed by performing a photolithography process on a resulting structure to form a first metal line pattern, and performing a chemical mechanical planarization process to remove the first B metal thin layer; and
   a second stage metal line formed by sequentially applying, on the first stage metal line, a second aluminum layer and a second metal thin layer formed as a double layer of titanium and titanium nitride, performing a photolithography process to form a second metal line pattern which is the same as the first metal line pattern, applying a second intermetallic dielectric layer, and performing a chemical mechanical planarization process to remove the second intermetallic dielectric layer,
   wherein the second aluminum layer is in direct contact with the first aluminum layer, and
   wherein the first A metal thin layer and the first aluminum layer have a substantially same width.

2. A semiconductor device, comprising:
- an interlayer insulating layer formed on a lower metal line, the interlayer insulating layer having a via formed therein;
- a first intermetallic dielectric (IMD) layer formed on the interlayer insulating layer;
- a first metal thin layer connected to the via in the first IMD layer;
- a first aluminum layer formed on the first metal thin layer in the first IMD layer;
- a second IMD layer formed on the first IMD layer;
- a second aluminum layer formed on the first aluminum layer in the second IMD layer, wherein the second aluminum layer is in direct contact with the first aluminum layer; and
- a second metal thin layer formed on the second aluminum layer in the second IMD layer,
- wherein the first metal thin layer and the first aluminum layer have a substantially same width.

3. The semiconductor device according to claim 2, wherein the first metal thin layer comprises a single layer of Ti or TiN.

4. The semiconductor device according to claim 2, wherein the first metal thin layer comprises a double layer formed of Ti and TiN.

5. The semiconductor device according to claim 2, wherein the first metal thin layer has a thickness ranging from about 100 Å to about 400 Å.

6. The semiconductor device according to claim 2, wherein the first aluminum layer has a thickness ranging from about 500 Å to about 2000 Å.

7. The semiconductor device according to claim 2, wherein the second metal thin layer has a thickness ranging from about 100 Å to about 400 Å.

8. The semiconductor device according to claim 2, wherein the second aluminum layer has a thickness ranging from about 500 Å to about 2000 Å.

9. The aluminum line according to claim 2, wherein an upper-most surface of the first metal thin layer and a lower-most surface of the first aluminum layer have a substantially same area.

* * * * *